US012255373B2

(12) United States Patent
Uemichi et al.

(10) Patent No.: US 12,255,373 B2
(45) Date of Patent: Mar. 18, 2025

(54) DIGITAL PHASE SHIFTER

(71) Applicant: Fujikura Ltd., Tokyo (JP)

(72) Inventors: Yusuke Uemichi, Sakura (JP); Yo Yamaguchi, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 18/018,342

(22) PCT Filed: Aug. 8, 2022

(86) PCT No.: PCT/JP2022/030254
§ 371 (c)(1),
(2) Date: Jan. 27, 2023

(87) PCT Pub. No.: WO2023/157341
PCT Pub. Date: Aug. 24, 2023

(65) Prior Publication Data
US 2024/0258669 A1   Aug. 1, 2024

(30) Foreign Application Priority Data
Feb. 16, 2022   (JP) ................. 2022-022266

(51) Int. Cl.
*H01P 1/18*   (2006.01)
(52) U.S. Cl.
CPC ............. *H01P 1/184* (2013.01); *H01P 1/18* (2013.01)
(58) Field of Classification Search
CPC .. H01P 1/18; H01P 1/184; H01P 1/185; H01P 1/182; H01P 9/00; H03H 11/26;
(Continued)

(56) References Cited

U.S. PATENT DOCUMENTS 10,291,282 B1   5/2019   Lin et al.

FOREIGN PATENT DOCUMENTS

| GB | 2162375 A | 1/1986 |
|---|---|---|
| JP | S63-090301 U | 6/1988 |
| JP | 2002-043804 A | 2/2002 |

OTHER PUBLICATIONS

Sadhu Bodhisatwa et al., "A 28-GHz 32-Element TRX Phased-Array IC With Concurrent Dual-Polarized Operation and Orthogonal Phase and Gain Control for 5G Communications", IEEE Journal of Solid-State Circuits, IEEE, USA, vol. 52, No. 12, Dec. 1, 2017 (Dec. 1, 2017), pp. 3373-3391; cited in the Search Report dated Feb. 8, 2024.

(Continued)

*Primary Examiner* — Stephen E. Jones
(74) *Attorney, Agent, or Firm* — WHDA, LLP

(57) ABSTRACT

A digital phase shifter includes a plurality of digital phase shift circuits connected in cascade and one or more bend-type connection units each configured to make a connection between two digital phase shift circuits of the plurality of digital phase shift circuits. Each of the digital phase shift circuits includes at least a signal line, a pair of inner lines provided at both sides of the signal line, a pair of outer lines provided outside of the inner lines, a first ground conductor connected to one ends of the inner lines and the outer lines, a second ground conductor connected to the other ends of the outer lines, and a pair of electronic switches provided between the other ends of the inner lines and the second ground conductor. Each of the digital phase shift circuits is a circuit set in a low-delay mode in which a return current flows through the inner line or a high-delay mode in which a return current flows through the outer line. The plurality of digital phase shift circuits connected in cascade are arranged in a spiral shape via the connection units.

10 Claims, 10 Drawing Sheets

(58) Field of Classification Search
CPC ...... H03H 11/265; H03H 11/16; H03H 11/20; H03H 11/18; H03H 17/0009; H03H 17/08; H03K 2005/00286
See application file for complete search history.

(56) References Cited

OTHER PUBLICATIONS

Yishay Roee Ben et al., "PVT Robust Passive Phase Shifter for 5G MIMO Applications", 2020 IEEE 20th Topical Meeting on Silicon Monolithic Integrated Circuits in RF Systems (SIRF), IEEE, Jan. 26, 2020 (Jan. 26, 2020), pp. 13-15; cited in the Search Report dated Feb. 8, 2024.

Yahya Tousi et al., "A Ka-band Digitally-Controlled Phase Shifter with sub-degree Phase Precision", 2016,IEEE, RFIC, cited in the specification and the ISR.

International Search Report dated Oct. 25, 2022 issued in counterpart International Application No. PCT/JP2022/030254.

DIGITAL PHASE SHIFTER

TECHNICAL FIELD

The present invention relates to a digital phase shifter.

Priority is claimed on Japanese Patent Application No. 2022-022266, filed Feb. 16, 2022, the content of which is incorporated herein by reference.

BACKGROUND ART

In the following Non-Patent Document 1, a digitally controlled phase shift circuit for high-frequency signals such as microwaves, sub-millimeter waves, or millimeter waves (a digital phase shift circuit) is disclosed. A large number of digital phase shift circuits are mounted on a semiconductor substrate in a state in which the digital phase shift circuits are connected in cascade. That is, the digital phase shift circuit is a unitary unit in the configuration of an actual digital phase shifter and a desired function is exhibited by connecting several tens of digital phase shift circuits in cascade.

The digital phase shift circuit includes at least a signal line, a pair of inner lines provided at both sides of the signal line, a pair of outer lines provided outside of the inner lines, a first ground conductor connected to one ends of the inner lines and the outer lines, a second ground conductor connected to the other ends of the outer lines, and a pair of electronic switches provided between the other ends of the inner lines and the second ground conductor.

The digital phase shift circuit switches an operation mode to a low-delay mode or a high-delay mode by switching a return current flowing through a pair of inner lines or a pair of outer lines due to the transmission of a high-frequency signal in the signal line in accordance with an open or closed state of each of the pair of electronic switches. That is, in the digital phase shift circuit, the operation mode is the low-delay mode when a return current flows through the pair of inner lines and the operation mode is the high-delay mode when a return current flows through the pair of outer lines.

CITATION LIST

Non-Patent Document

[Non-Patent Document 1]
  A Ka-band Digitally-Controlled Phase Shifter with Sub-degree Phase Precision (2016, IEEE, RFIC)

SUMMARY OF INVENTION

Technical Problem

When the configuration of the digital phase shifter is a configuration in which the above digital phase shift circuits are connected in a line, the length of the digital phase shifter increases. In order to shorten the length of the digital phase shifter, a configuration in which the configuration of the digital phase shifter is bent using a connection unit such as a bend-type line having a bent structure is conceivable.

When the configuration of the digital phase shifter is bent, the number of portions where return currents flowing through outer lines of two digital phase shift circuits arranged to face each other are opposite each other may increase according to a bending method. In these portions, if a distance between the outer lines of the digital phase shift circuit arranged to face each other is excessively short, magnetic fields generated in the outer lines weaken each other. Thus, from the viewpoint of the phase shift operation of the digital phase shifter, it is desirable that the digital phase shifter have a bent configuration so that there are as few portions where magnetic fields generated in the outer lines weaken each other as possible.

The present invention is made in view of such circumstances and an objective of the present invention is to provide a small-sized digital phase shifter capable of reducing the number of portions where magnetic fields generated in outer lines weaken each other.

Solution to Problem

According to an aspect of the present invention, there is provided a digital phase shifter including: a plurality of digital phase shift circuits connected in cascade; and one or more bend-type connection units each configured to make a connection between two digital phase shift circuits of the plurality of digital phase shift circuits, wherein each of the digital phase shift circuits includes at least a signal line, a pair of inner lines provided at both sides of the signal line, a pair of outer lines provided outside of the inner lines, a first ground conductor connected to one ends of the inner lines and the outer lines, a second ground conductor connected to the other ends of the outer lines, and a pair of electronic switches provided between the other ends of the inner lines and the second ground conductor, wherein each of the digital phase shift circuits is a circuit set in a low-delay mode in which a return current flows through the inner line or a high-delay mode in which a return current flows through the outer line, and wherein the plurality of digital phase shift circuits connected in cascade are arranged in a spiral shape via the connection units.

According to this configuration, a small-sized digital phase shifter capable of reducing the number of portions where magnetic fields generated in outer lines weaken each other is provided.

Also, according to an aspect of the present invention, the digital phase shifter may further include a transmission line connected to the signal line of a terminal digital phase shift circuit that is the digital phase shift circuit located at an innermost circumference among the plurality of digital phase shift circuits arranged in the spiral shape and through which a high-frequency signal flowing through the signal line is transmitted, wherein the transmission line may be formed on a layer different from a layer where the signal line is formed.

Also, according to an aspect of the present invention, the digital phase shifter may further include a transmission line connected to the signal line of a terminal digital phase shift circuit that is the digital phase shift circuit located at an innermost circumference among the plurality of digital phase shift circuits arranged in the spiral shape and through which a high-frequency signal flowing through the signal line is transmitted, wherein the transmission line may be formed above or below the connection unit.

Also, according to an aspect of the present invention, the digital phase shifter may include a transmission-unit ground layer arranged at least above and below the transmission line, wherein the transmission-unit ground layer may be connected to at least one of the inner line and the outer line via a transmission-unit via-hole.

Also, according to an aspect of the present invention, the digital phase shifter may include a ground line connected to the inner line of the terminal digital phase shift circuit and extending along the transmission line.

Also, according to an aspect of the present invention, in the digital phase shifter, the transmission-unit ground layer may be connected to at least the ground line via the transmission-unit via-hole or a via-hole different from the transmission-unit via-hole.

Also, according to an aspect of the present invention, in the digital phase shifter, the connection line may have a structure that is bent at 90 degrees.

Also, according to an aspect of the present invention, in the digital phase shifter, the connection unit may include a first connection line configured to connect the signal line of one digital phase shift circuit of the two digital phase shift circuits and the signal line of the other digital phase shift circuit of the two digital phase shift circuits; a second connection line configured to connect the inner line of the one digital phase shift circuit and the inner line of the other digital phase shift circuit; and a connection-unit ground layer arranged at least one of above and below the first connection line.

Also, according to an aspect of the present invention, the digital phase shifter may further include a third connection line configured to connect the outer line of the one digital phase shift circuit and the outer line of the other digital phase shift circuit.

Also, according to an aspect of the present invention, in the digital phase shifter, the second connection line and the connection-unit ground layer may be connected by a connection-unit via-hole.

Advantageous Effects of Invention

According to the present invention, it is possible to provide a small-sized digital phase shifter capable of reducing the number of portions where magnetic fields generated in outer lines weaken each other.

DESCRIPTION OF EMBODIMENTS

Hereinafter, a digital phase shifter according to the present embodiment are described with reference to the drawings.

Figure 1:
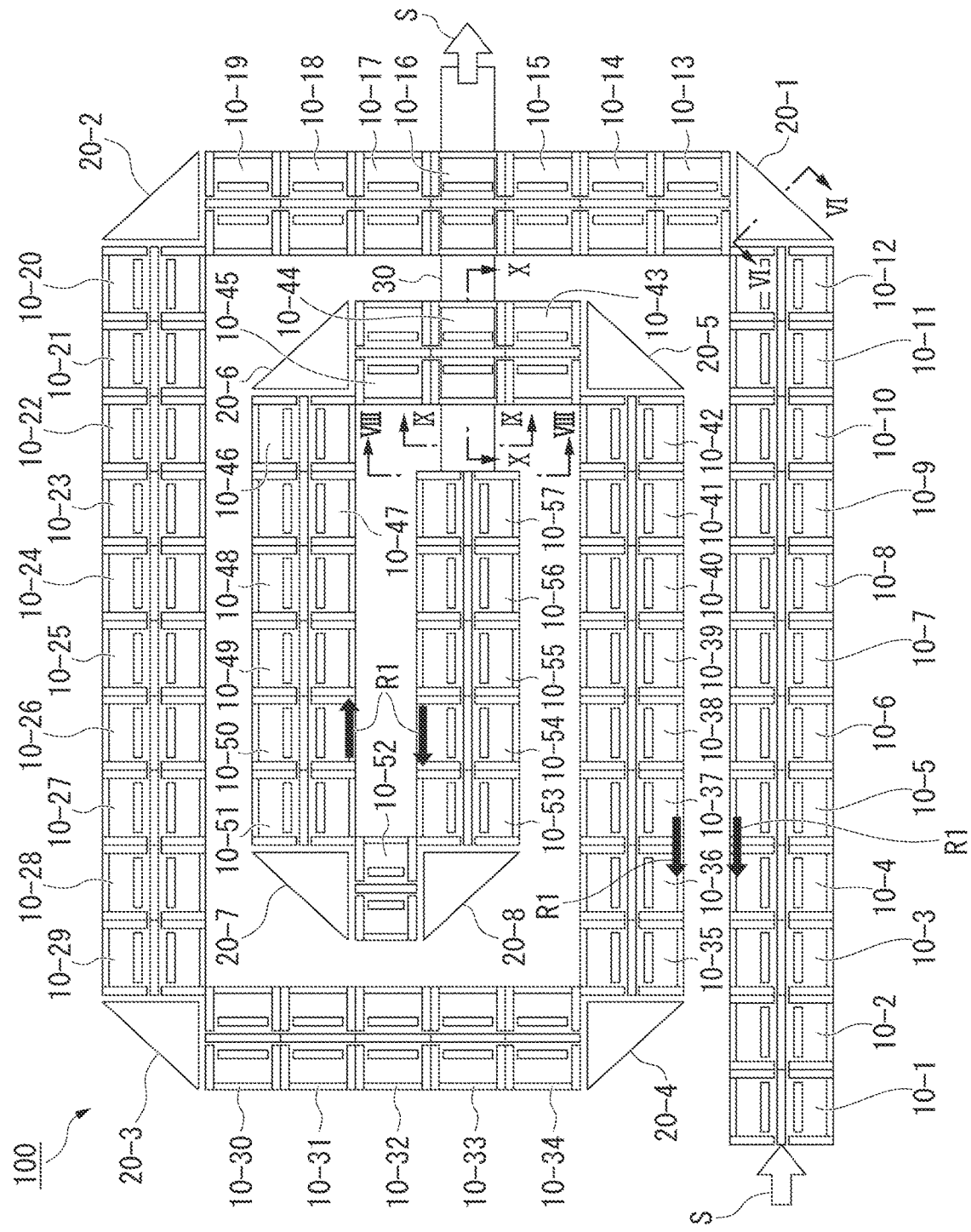
FIG. 1 is a schematic configuration diagram of a digital phase shifter according to the present embodiment.

FIG. 1 is a diagram showing an example of a configuration of a digital phase shifter 100 according to the present embodiment. The digital phase shifter 100 includes a plurality of digital phase shift circuits 10, one or more connection units 20, and a transmission unit 30. In the digital phase shifter 100, a phase of a high-frequency signal S in a predetermined frequency band is shifted in phase by a plurality of digital phase shift circuits 10 connected in cascade. The signal S is a high-frequency signal having a frequency band of microwave, sub-millimeter wave, millimeter wave or the like.

A "connection" to be described below is an electrical connection. The electrical connection is a connection in which an electrical signal can be directly or indirectly transmitted. Therefore, connections to be described below include an indirect and electrical connection via a conductor or the like as well as a direct connection.

The plurality of digital phase shift circuits 10 are electrically connected in cascade. Although 57 digital phase shift circuits 10 are connected in cascade in the example shown in FIG. 1, the present invention is not limited thereto and two or more digital phase shift circuits 10 may be connected in cascade. In the example shown in FIG. 1, for the convenience of description, the 57 digital phase shift circuits 10 connected in cascade are referred to as digital phase shift circuits 10-1, 10-2, to 10-57 in the order in which the signal S flows. However, the direction in which the signal S flows may be reversed. In addition, details of the digital phase shift circuits 10 are described below.

The connection unit 20 has a bend-type shape. In the example shown in FIG. 1, the connection unit 20 has a 90-degree bend shape (a structure that is bent at 90 degrees). However, the shape of the connection unit 20 is not limited to a 90-degree bend shape. The digital phase shifter 100 does not have a structure in which the plurality of digital phase shift circuits 10 are all arranged side by side in a line but has a spiral structure in which the digital phase shifter 100 is bent along the way by one or more connection units 20. That is, the plurality of digital phase shift circuits 10 connected in cascade are arranged in a spiral shape via the connection units 20.

That is, the plurality of digital phase shift circuits 10 are arranged so that two digital phase shift circuits 10 facing each other among the digital phase shift circuits 10 (such as two digital phase shift circuits 10-3 and 10-35 and two digital phase shift circuits 10-16 and 10-44) extend in the same direction, separated in a direction orthogonal to the extension direction, and arranged parallel to each other and the signal S flows through the signal lines 1 of the two digital phase shift circuits 10 in the same direction.

The connection unit 20 is installed at a bended location in a plurality of digital phase shift circuits 10 connected in cascade. The connection unit 20 is installed at the bended location and makes a connection between the first digital phase shift circuit and the second digital phase shift circuit that are the two digital phase shift circuits 10. In the example shown in FIG. 1, the digital phase shifter 100 includes eight connection units 20-1 to 20-8.

The connection unit 20-1 makes a connection between a digital phase shift circuit 10-12 (a first digital phase shift circuit) and a digital phase shift circuit 10-13 (a second digital phase shift circuit). The connection unit 20-2 makes a connection between a digital phase shift circuit 10-19 (a first digital phase shift circuit) and a digital phase shift circuit 10-20 (a second digital phase shift circuit). The connection unit 20-3 makes a connection between a digital phase shift circuit 10-29 (a first digital phase shift circuit) and a digital phase shift circuit 10-30 (a second digital phase shift circuit). The connection unit 20-4 makes a connection between a digital phase shift circuit 10-34 (a first digital phase shift circuit) and a digital phase shift circuit 10-35 (a second digital phase shift circuit).

The connection unit 20-5 makes a connection between a digital phase shift circuit 10-42 (a first digital phase shift circuit) and a digital phase shift circuit 10-43 (a second digital phase shift circuit). The connection unit 20-6 makes a connection between a digital phase shift circuit 10-45 (a first digital phase shift circuit) and a digital phase shift circuit 10-46 (a second digital phase shift circuit). The connection unit 20-7 makes a connection between a digital phase shift circuit 10-51 (a first digital phase shift circuit) and a digital phase shift circuit 10-52 (a second digital phase shift circuit). The connection unit 20-8 makes a connection between the digital phase shift circuit 10-52 (a first digital phase shift circuit) and a digital phase shift circuit 10-53 (a second digital phase shift circuit). Thus, the plurality of digital phase shift circuits 10-1 to 10-57 are arranged in a spiral shape via the connection units 20-1 to 20-8. In addition, details of the connection units 20 are described below.

The transmission unit 30 is connected to a terminal digital phase shift circuit located at the innermost circumference among the plurality of digital phase shift circuits 10-1 to 10-57 arranged in a spiral shape. In the example shown in FIG. 1, the terminal digital phase shift circuit is the digital phase shift circuit 10-57. The transmission unit 30 includes a transmission line through which a signal S flowing through the signal line 1 of the terminal digital phase shift circuit is transmitted. The transmission unit 30 is extended to the outside of the outermost circumference of the plurality of digital phase shift circuits 10-1 to 10-57 arranged in a spiral shape.

The transmission unit 30 shown in FIG. 1 is formed on a layer different from the layer where the signal line 1 of the digital phase shift circuit 10 is formed. For example, the transmission unit 30 is formed on a layer above or below the layer where the signal line 1 of the digital phase shift circuit 10 is formed to prevent a collision with the digital phase shift circuit 10. In addition, details of the transmission unit 30 are described below.

Figure 2:
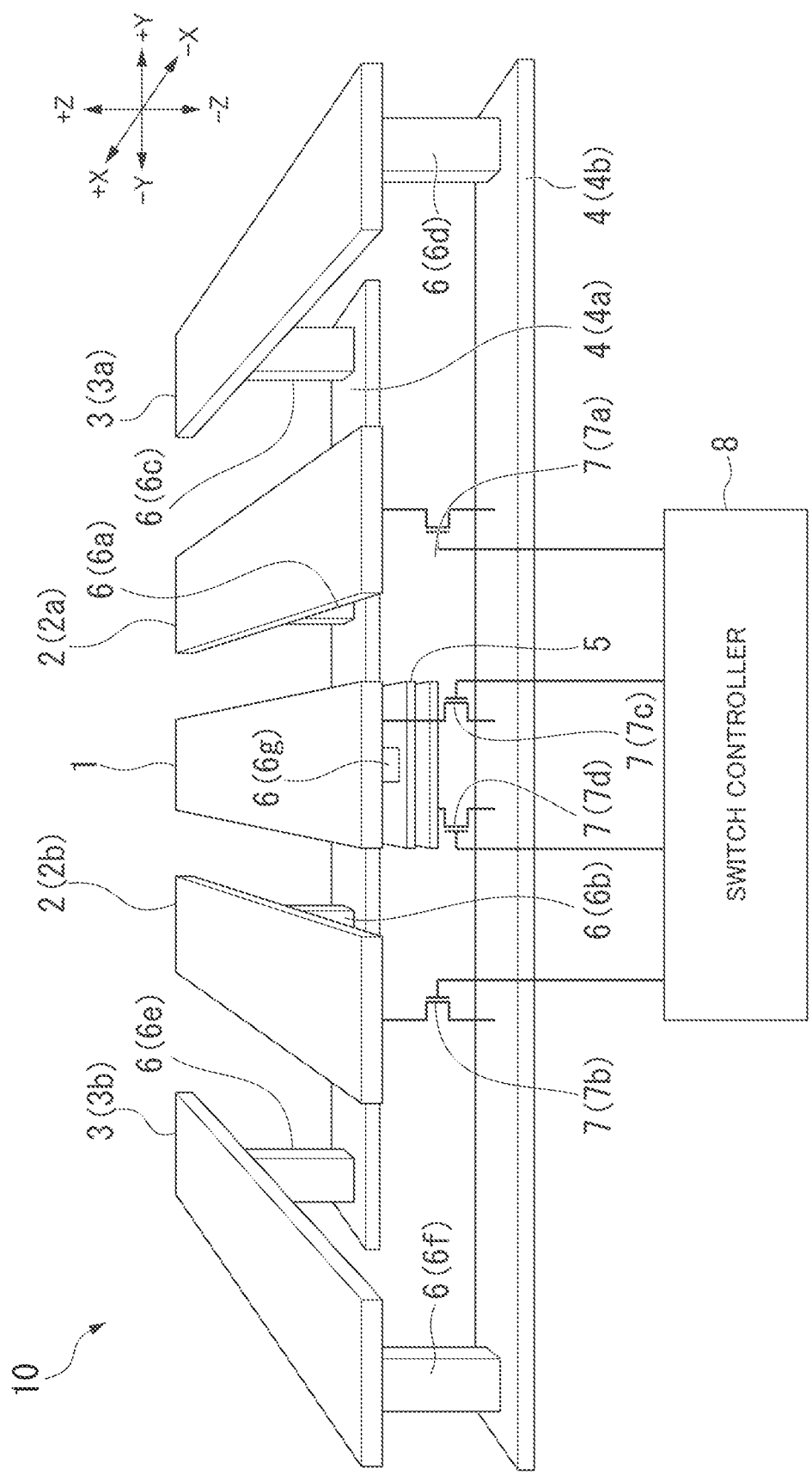
FIG. 2 is a perspective view of a digital phase shift circuit according to the present embodiment.

Hereinafter, a configuration of the digital phase shift circuit 10 according to the present embodiment are described with reference to FIG. 2. FIG. 2 is a perspective view of the digital phase shift circuit 10 according to the present embodiment. As shown in FIG. 2, the digital phase shift circuit 10 includes a signal line 1, two inner lines 2 (a first inner line 2a and a second inner line 2b), two outer lines 3 (a first outer line 3a and a second outer line 3b), two ground conductors 4 (a first ground conductor 4a and a second ground conductor 4b), a parallel plate capacitor 5, a plurality of connection conductors 6, four electronic switches 7 (a first electronic switch 7a, a second electronic switch 7b, a third electronic switch 7c, and a fourth electronic switch 7d), and a switch controller 8.

The signal line 1 is a linear belt-shaped conductor extending in a predetermined direction. That is, the signal line 1 is a long plate-shaped conductor having a certain width W1, a certain thickness, and a predetermined length. In the example shown in FIG. 2, a signal S flows from the front side to the back side through the signal line 1.

In addition, a forward/backward direction shown in FIG. 2 is referred to as an X-axis direction. a left/right direction is referred to as a Y-axis direction, and an upward/downward direction (a vertical direction) is referred to as a Z-axis direction. Also, a +X-direction is a direction from the front side to the back side in the X-axis direction and a −X-direction is a direction opposite to the +X-direction. A +Y-direction is a right direction in the Y-axis direction and a −Y-direction is a direction opposite to the +Y-direction. A +Z-direction is an upward direction in the Z-axis direction, and a −Z-direction is a direction opposite to the +Z-direction.

The first inner line 2a is a linear belt-shaped conductor. That is, the first inner line 2a is a long plate-shaped conductor having a certain width, a certain thickness, and a predetermined length. The first inner line 2a extends in a direction that is the same as an extension direction of the signal line 1. The first inner line 2a is provided parallel to the signal line 1 and is separated from the signal line 1 by a predetermined distance. Specifically, the first inner line 2a is arranged to be separated from the signal line 1 by a predetermined distance at one side of the signal line 1. In other words, the first inner line 2a is arranged to be separated from the signal line 1 by a predetermined distance in the +Y-axis direction (the +Y-direction).

The second inner line 2b is a linear belt-shaped conductor. That is, the second inner line 2b is a long plate-shaped conductor having a certain width, a certain thickness, and a predetermined length like the first inner line 2a. The second inner line 2b extends in a direction that is the same as the extension direction of the signal line 1. The second inner line 2b is provided parallel to the signal line 1 and is separated from the signal line 1 by a predetermined distance. Specifically, the second inner line 2b is arranged to be separated from the signal line 1 by the predetermined distance at the other side of the signal line 1. In other words, the second inner line 2b is arranged to be separated from the signal line 1 by the predetermined distance in the −Y-axis direction (the −Y-direction).

The first outer line 3a is a linear belt-shaped conductor provided at a position farther from the signal line 1 than the first inner line 2a at the one side of the signal line 1. That is, the first outer line 3a is a linear belt-shaped conductor arranged further in the +Y-direction than the first inner line 2a. The first outer line 3a is a long plate-shaped conductor having a certain width, a certain thickness, and a predetermined length. The first outer line 3a is provided parallel to the signal line 1 at with separated by a predetermined distance from the signal line 1 in a state in which the first inner line 2a is sandwiched between the signal line 1 and the first outer line 3a. The first outer line 3a extends in a direction that is the same as the extension direction of the signal line 1 like the first inner line 2a and the second inner line 2b.

The second outer line 3b is a linear belt-shaped conductor provided at a position farther from the signal line 1 than the second inner line 2b at the other side of the signal line 1. That is, the second outer line 3b is a linear belt-shaped conductor arranged further in the −Y-direction than the second inner line 2b. The second outer line 3b is a long plate-shaped conductor having a certain width, a certain thickness, and a predetermined length like the first outer line 3a. The second outer line 3b is provided parallel to the signal line 1 with separated by the predetermined distance from the signal line 1 in a state in which the second inner line 2b is sandwiched between the second outer line 3b and the signal line 1. The second outer line 3b extends in a direction that is the same as the extension direction of the signal line 1 like the first inner line 2a and the second inner line 2b.

The first ground conductor 4a is a linear belt-shaped conductor provided at one end side (one end side in the X-axis direction) of each of the first inner line 2a, the second inner line 2b, the first outer line 3a, and the second outer line 3b. The first ground conductor 4a is electrically connected to one ends of the first inner line 2a, the second inner line 2b, the first outer line 3a, and the second outer line 3b. The first ground conductor 4a is a long plate-shaped conductor having a certain width, a certain thickness, and a predetermined length.

The first ground conductor 4a is provided orthogonal to the first inner line 2a, the second inner line 2b, the first outer line 3a, and the second outer line 3b that extend in the same direction. That is, the first ground conductor 4a is arranged to extend in the Y-axis direction. The first ground conductor 4a is provided below the first inner line 2a, the second inner line 2b, the first outer line 3a, and the second outer line 3b with separated by a predetermined distance.

In the example shown in FIG. 2, the first ground conductor 4a is set so that one end which is an end in the +Y-direction of the first ground conductor 4a is located at substantially the same position as the right side edge portion of the first outer line 3a. In the example shown in FIG. 2, the first ground conductor 4a is set so that the other end of the first ground conductor 4a which is an end in the −Y-direction is located at substantially the same position as the left side edge portion of the second outer line 3b.

The second ground conductor 4b is a linear belt-shaped conductor provided at the other end side (the other end side in the X-axis direction) of each of the first inner line 2a, the second inner line 2b, the first outer line 3a, and the second outer line 3b. The second ground conductor 4b is a long plate-shaped conductor having a certain width, a certain thickness, and a predetermined length like the first ground conductor 4a.

The second ground conductor 4b is arranged parallel to the first ground conductor 4a and is provided orthogonal to the first inner line 2a, the second inner line 2b, the first outer line 3a, and the second outer line 3b like the first ground conductor 4a. The second ground conductor 4b is provided below the first inner line 2a, the second inner line 2b, the first outer line 3a, and the second outer line 3b with separated by a predetermined distance.

The second ground conductor 4b is provided so that one end, which is an end in the +Y-direction of the second ground conductor 4b is located at substantially the same position as the right side edge portion of the first outer line 3a. The second ground conductor 4b is set so that the other end, which is an end in the −Y-direction of the second ground conductor 4b is located at substantially the same position as the left side edge portion of the second outer line 3b. In the example shown in FIG. 2, the second ground conductor 4b is located at the same position as the first ground conductor 4a in the Y-axis direction.

The parallel plate capacitor 5 is provided between the other end of the signal line 1 and the second ground conductor 4b. For example, the parallel plate capacitor 5 has an upper electrode connected to the signal line 1 and a lower electrode electrically connected to the fourth electronic switch 7d. For example, the parallel plate capacitor 5 is a thin film capacitor having a metal insulator metal (MIM) structure. In addition, a capacitance value C of the digital phase shift circuit 10 includes a capacitance value Ca of the parallel plate capacitor 5. Also, instead of a parallel plate capacitor 5, a comb tooth type capacitor may be used.

The plurality of connection conductors 6 include at least connection conductors 6a to 6f. The connection conductor 6a is a conductor that electrically and mechanically connects one end of the first inner line 2a and the first ground conductor 4a. For example, the connection conductor 6a is a conductor extending in the Z-axis direction and has one end (upper end) connected to the lower surface of the first inner line 2a and the other end (lower end) connected to the upper surface of the first ground conductor 4a.

The connection conductor 6b is a conductor that electrically and mechanically connects one end of the second inner line 2b and the first ground conductor 4a. For example, the connection conductor 6b is a conductor extending in the Z-axis direction like the connection conductor 6a and has one end (upper end) connected to the lower surface of the second inner line 2b and the other end (lower end) connected to the upper surface of the first ground conductor 4a.

The connection conductor 6c is a conductor that electrically and mechanically connects one end of the first outer line 3a and the first ground conductor 4a. For example, the connection conductor 6c is a conductor extending in the Z-axis direction and has one end (upper end) connected to the lower surface at one end of the first outer line 3a and the other end (lower end) connected to the upper surface of the first ground conductor 4a.

The connection conductor 6d is a conductor that electrically and mechanically connects the other end of the first outer line 3a and the second ground conductor 4b. For example, the connection conductor 6d is a conductor extending in the Z-axis direction and has one end (upper end) connected to the lower surface at the other end of the first outer line 3a and the other end (lower end) connected to the upper surface of the second ground conductor 4b.

The connection conductor 6e is a conductor that electrically and mechanically connects one end of the second outer line 3b and the first ground conductor 4a. For example, the connection conductor 6e is a conductor extending in the Z-axis direction and has one end (upper end) connected to the lower surface at one end of the second outer line 3b and the other end (lower end) connected to the upper surface of the first ground conductor 4a.

The connection conductor 6f is a conductor that electrically and mechanically connects the other end of the second outer line 3b and the second ground conductor 4b. For example, the connection conductor 6f is a conductor extending in the Z-axis direction and has one end (upper end) connected to the lower surface at the other end of the second outer line 3b and the other end (lower end) connected to the upper surface of the second ground conductor 4b.

The connection conductor 6g is a conductor that electrically and mechanically connects the other end of the signal line 1 and the upper electrode of the parallel plate capacitor 5. For example, the connection conductor 6g is a conductor extending in the Z-axis direction and has one end (upper end) connected to the lower surface at the other end of the signal line 1 and the other end (lower end) connected to the upper electrode of the parallel plate capacitor 5.

The first electronic switch 7a is connected between the other end of the first inner line 2a and the second ground conductor 4b. The first electronic switch 7a is, for example, a metal oxide semiconductor field effect transistor (MOSFET) and includes a drain terminal electrically connected to the other end of the first inner line 2a, a source terminal electrically connected to the second ground conductor 4b, and a gate terminal electrically connected to the switch controller 8.

The first electronic switch 7a is controlled to a closed state or an open state based on the gate signal input from the switch controller 8 to the gate terminal. The closed state is a state in which the drain terminal and the source terminal are conducted. The open state is a state in which the drain terminal and the source terminal are not conducted and the electrical connection thereof is disconnected. The first electronic switch 7a is switched to a conduction state in which the other end of the first inner line 2a and the second ground conductor 4b are electrically connected or a disconnection state in which the electrical connection therebetween is disconnected under control of the switch controller 8.

The second electronic switch 7b is connected to the other end of the second inner line 2b and the second ground conductor 4b therebetween. The second electronic switch 7b is, for example, a MOSFET, and includes a drain terminal connected to the other end of the second inner line 2b, a source terminal connected to the second ground conductor 4b, and a gate terminal connected to the switch controller 8. For example, the size of the second electronic switch 7b is greater than or equal to a width of the second ground conductor 4b.

The second electronic switch 7b is controlled in a closed state or an open state based on a gate signal input from the switch controller 8 to the gate terminal. The second electronic switch 7b is switched to a conduction state in which the other end of the second inner line 2b and the second ground conductor 4b are is electrically connected or a disconnection state in which the electrical connection is disconnected under a control of the switch controller 8.

The third electronic switch 7c is connected to the other end of the signal line 1 and the second ground conductor 4b therebetween. The third electronic switch 7c is, for example, a MOSFET, and includes a drain terminal connected to the other end of the signal line 1, a source terminal connected to the second ground conductor 4b, and a gate terminal connected to the switch controller 8. In the example shown in FIG. 2, the third electronic switch 7c is provided on the other end side of the signal line 1, the present invention is not limited thereto and the third electronic switch 7c may be provided on one end side of the signal line 1. In addition, the third electronic switch 7c may not be used if it is not necessary.

The third electronic switch 7c is controlled in a closed state or an open state based on the gate signal input from the switch controller 8 to the gate terminal. The third electronic switch 7c is switched to a conduction state in which the other end of the signal line 1 and the second ground conductor 4b are electrically connected or a disconnection state in which the electrical connection therebetween is disconnected under a control process of the switch controller 8.

The fourth electronic switch 7d is connected in series to the parallel plate capacitor 5 between the other end of the signal line 1 and the second ground conductor 4b. The fourth electronic switch 7d is, for example, a MOSFET. In the example shown in FIG. 2, the fourth electronic switch 7d includes a drain terminal connected to the lower electrode of the parallel plate capacitor 5, a source terminal connected to the second ground conductor 4b, and a gate terminal connected to the switch controller 8.

The fourth electronic switch 7d is controlled to a closed state or an open state based on a gate signal input from the switch controller 8 to the gate terminal. The fourth electronic switch 7d is switched to a conduction state in which the lower electrode of the parallel plate capacitor 5 and the second ground conductor 4b are electrically connected or a disconnection state in which the electrical connection is disconnected under a control of the switch controller 8.

The switch controller 8 is a control circuit that controls the first electronic switch 7a, the second electronic switch 7b, the third electronic switch 7c, and the fourth electronic switch 7d, which are a plurality of electronic switches 7. For example, the switch controller 8 includes four output ports. The switch controller 8 respectively controls the plurality of electronic switches 7 to an open state or a closed state by outputting respective gate signals from the respective output ports and supplying the gate signals to the respective gate terminals of the plurality of electronic switches 7.

Although a schematic diagram in which the digital phase shift circuit 10 is viewed in perspective so that the mechanical structure of the digital phase shift circuit 10 is easily understood is shown in FIG. 2, the actual digital phase shift circuit 10 is formed as a multilayer structure using semiconductor manufacturing technology.

As an example, in the digital phase shift circuit 10, the signal line 1, the first inner line 2a, the second inner line 2b, the first outer line 3a, and the second outer line 3b are formed on the first conductive layer. The first ground conductor 4a and the second ground conductor 4b are formed on a second conductive layer facing the first conductive layer with an insulating layer sandwiched therebetween. A component formed on the first conductive layer and a component formed on the second conductive layer are connected to each other through via-holes. The plurality of connection conductors 6 correspond to the via-holes embedded in the insulating layer.

Figure 3:
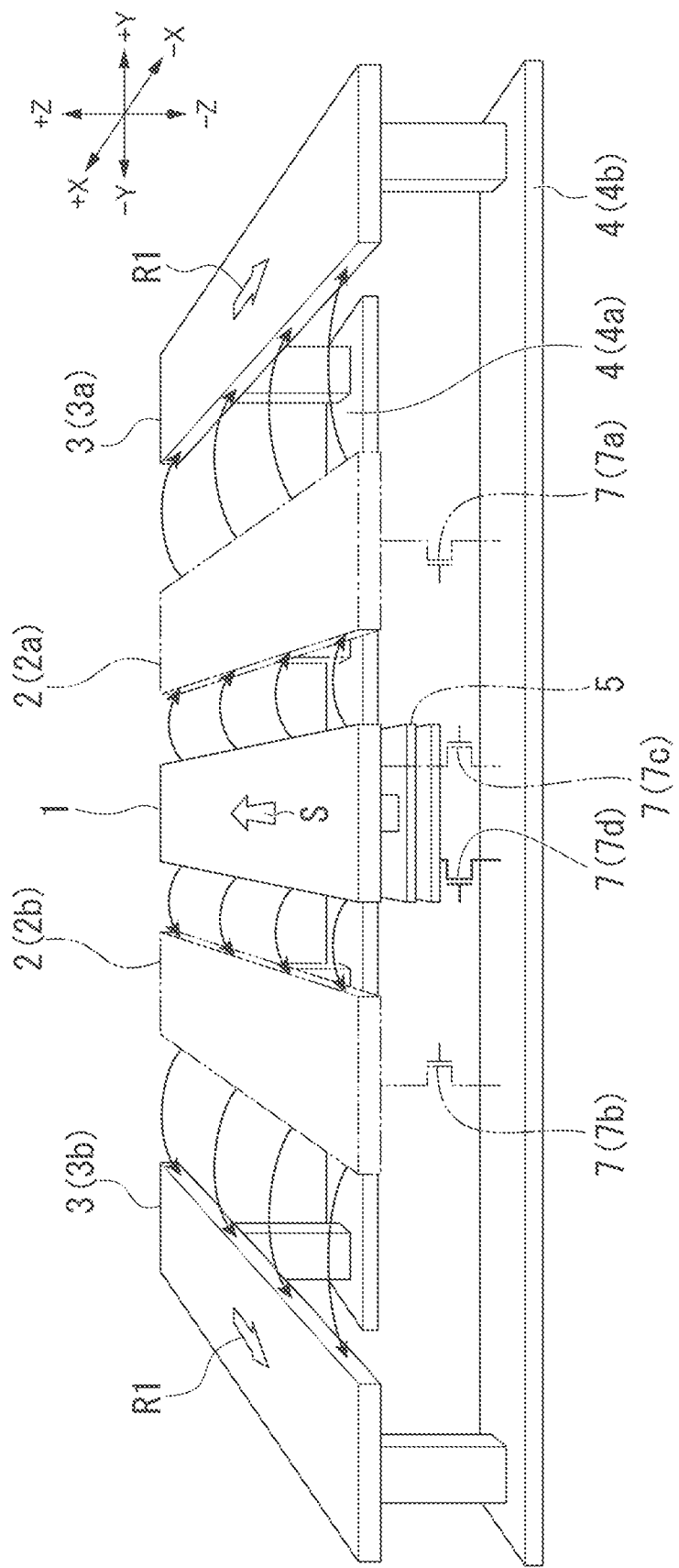
FIG. 3 is a diagram for describing a high-delay mode according to the present embodiment.

Next, the operation of the digital phase shift circuit 10 according to the present embodiment are described with reference to FIGS. 3 and 4. The digital phase shift circuit 10 has a high-delay mode and a low-delay mode as operation modes. The digital phase shift circuit 10 operates in the high-delay mode or the low-delay mode.

(High-Delay Mode)

The high-delay mode is a mode in which a first phase difference is generated in the signal S. In the high-delay mode, as shown in FIG. 3, the first electronic switch 7a and the second electronic switch 7b are controlled to the open state and the fourth electronic switch 7d is controlled to the closed state.

The first electronic switch 7a is controlled to the open state and therefore the electrical connection between the other end of the first inner line 2a and the second ground conductor 4b is disconnected. The second electronic switch 7b is controlled in the open state and therefore the electrical connection between the other end of the second inner line 2b and the second ground conductor 4b is disconnected. The fourth electronic switch 7d is controlled to the closed state and therefore the other end of the signal line 1 is connected to the second ground conductor 4b through the parallel plate capacitor 5.

When the signal S propagates through the signal line 1 from the input end (other end) to the output end (one end), a return current R1 flows from the one end to the other end in a direction opposite to the signal S (a direction in which the signal S propagates). That is, the return current R1 is a current flowing in the −X direction, which is the direction opposite to the signal S flowing in the +X-direction. In the high-delay mode, since the first electronic switch 7a and the second electronic switch 7b are in the open state, as shown in FIG. 3, the return current R1 mainly flows through the first outer line 3a and the second outer line 3b in the −X-direction.

In the high-delay mode, since the return current R1 flows through the first outer line 3a and the second outer line 3b, an inductance value L is larger than that in the low-delay mode. A delay amount in the high-delay mode larger than a delay amount in the low-delay mode can be obtained. Also, the fourth electronic switch 7d is in the closed state, such that the capacitance value C is also large because the other end of the signal line 1 and the second ground conductor 4b are electrically connected by the parallel plate capacitor 5. Consequently, a delay amount in the high-delay mode larger than a delay amount in the low-delay mode can be obtained.
(Low-Delay Mode)

The low-delay mode is a mode in which a second phase difference smaller than the first phase difference is generated in the signal S. In the low-delay mode, as shown in FIG. 4, the first electronic switch 7a and the second electronic switch 7b are controlled to the closed state and the fourth electronic switch 7d is controlled to the open state.

The first electronic switch 7a is controlled to the closed state and therefore the other end of the first inner line 2a and the second ground conductor 4b are electrically connected. The second electronic switch 7b is controlled to the closed state and therefore the other end of the second inner line 2b and the second ground conductor 4b are electrically connected.

Figure 4:
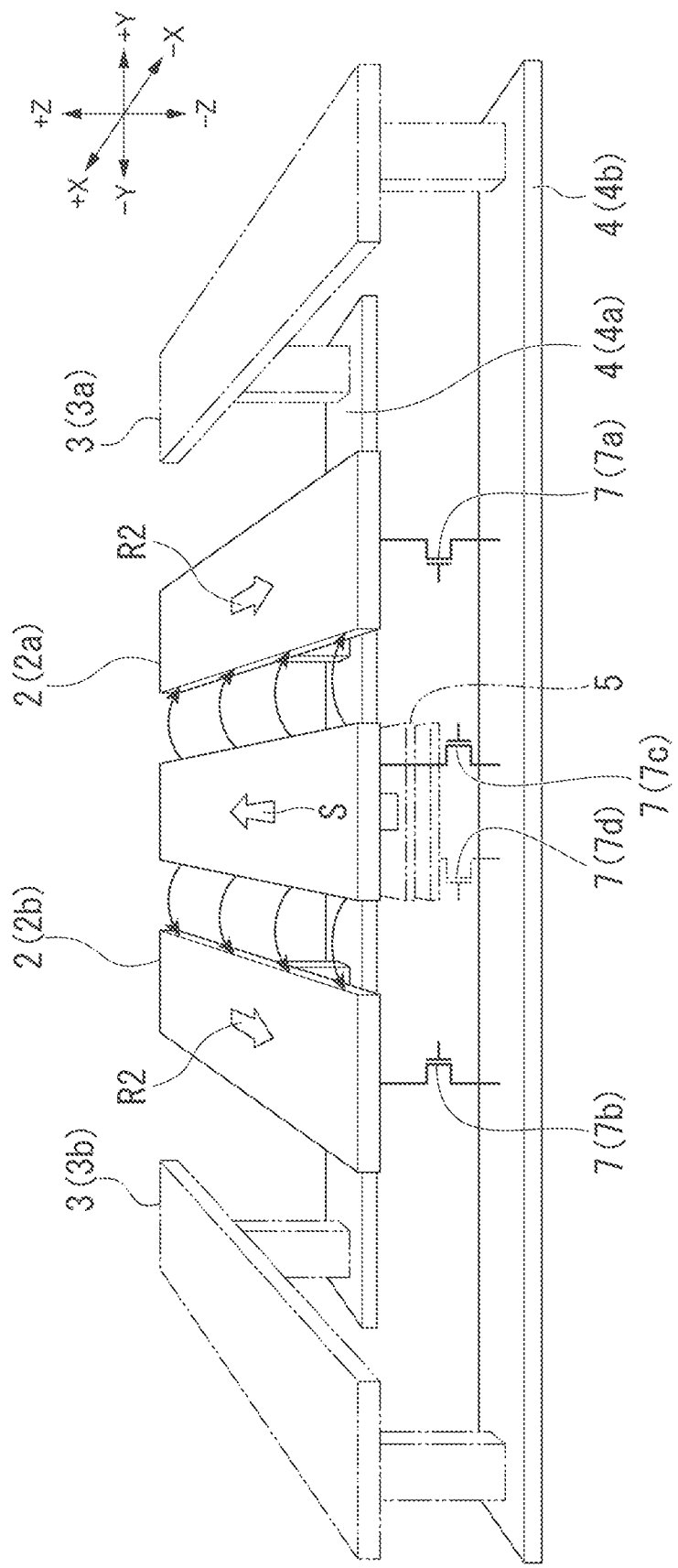
FIG. 4 is a diagram for describing a low-delay mode according to the present embodiment.

In the low-delay mode, since the first electronic switch 7a and the second electronic switch 7b are in the closed state, as shown in FIG. 4, the return current R2 mainly flows through the first inner line 2a and the second inner line 2b in the −X-direction. In the low-delay mode, since the return current R2 flows through the first inner line 2a and the second inner line 2b, the inductance value L is smaller than that in the high-delay mode. A delay amount in the low-delay mode is smaller than a delay amount in the high-delay mode. Also, since the parallel plate capacitor 5 is connected to the other end of the signal line 1 but the fourth electronic switch 7d is in the open state, the capacitance of the parallel plate capacitor 5 is non-functional and there is only parasitic capacitance that is significantly less than the capacitance of the parallel plate capacitor 5. Thus, a delay amount in the low-delay mode smaller than a delay amount in the high-delay mode can be obtained.

Here, in the low-delay mode, the loss of the signal line 1 can be intentionally increased by controlling the third electronic switch 7c in a closed state. This is to make the loss of the high-frequency signal in the low-delay mode substantially equal to the loss of the high-frequency signal in the high-delay mode.

That is, the loss of the high-frequency signal in the low-delay mode is clearly less than the loss of the high-frequency signal in the high-delay mode. This loss difference causes an amplitude difference in the high-frequency signal output from the digital phase shift circuit 10 when the operation mode is switched between the low-delay mode and the high-delay mode. In relation to this circumstance, in the digital phase shift circuit 10, the above-described amplitude difference may be eliminated by controlling the third electronic switch 7c in the closed state in the low-delay mode.

Figure 5:
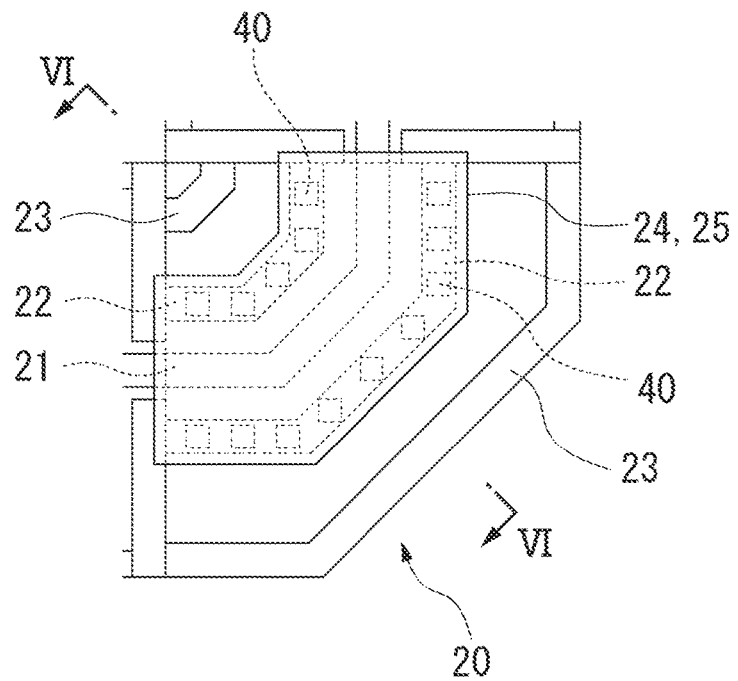
FIG. 5 is a plan view of a connection unit according to the present embodiment.
Figure 6:
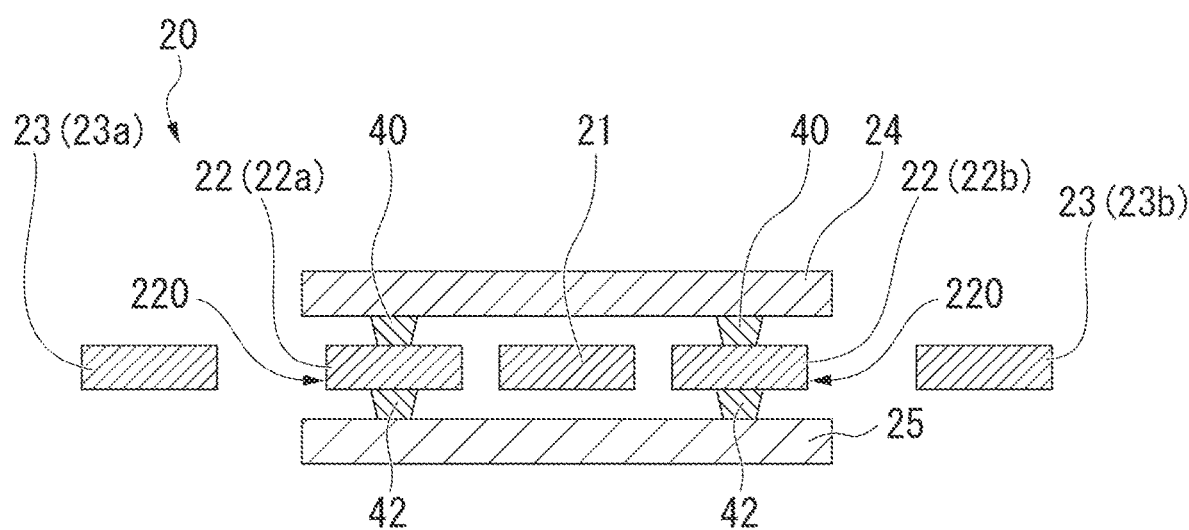
FIG. 6 is a first cross-sectional view of the connection unit according to the present embodiment.

Hereinafter, a configuration of the connection unit 20 according to the present embodiment are described with reference to FIGS. 5 and 6. FIG. 5 is a plan view of the connection unit 20 shown in FIG. 1. FIG. 6 is a cross-sectional view of the connection unit 20 taken along line VI-VI shown in FIGS. 1 and 5. As shown in FIGS. 5 and 6, the connection unit 20 includes a first connection line 21, a second connection line 22, a third connection line 23, a first ground layer 24, and a second ground layer 25.

The first connection line 21 is, for example, a long plate-shaped conductor having a constant width, a certain thickness, and a predetermined length. The first connection line 21 connects the signal line 1 of the first digital phase shift circuit and the signal line 1 of the second digital phase shift circuit. In addition, the width of the first connection line 21 may be the same as the width of the signal line 1 or may be wider than the width of the signal line 1.

The second connection line 22 is a long plate-shaped conductor having a constant width, a certain thickness, and a predetermined length. The second connection line 22 extends in a direction that is the same as the extension direction of the signal line 1. The second connection line 22 is provided parallel to the first connection line 21 and is separated from the first connection line 21 by a predetermined distance. Specifically, the second connection lines 22 are arranged to be separated from the first connection line 21 by a predetermined distance at both sides of the first connection line 21. In addition, in the following description, the second connection line 22 arranged at one side of the first connection line 21 may be referred to as a "second connection line 22a" and the second connection line 22 arranged at the other side of the first connection line 21 may be referred to as a "second connection line 22b." The second connection line 22 connects the inner line 2 of the first digital phase shift circuit and the inner line 2 of the second digital phase shift circuit.

The third connection lines 23 are belt-shaped conductors provided farther from the first connection line 21 than the second connection lines 22 at both sides that are one side and the other side of the first connection line 21. The third connection line 23 is provided parallel to the first connection line 21 with separated by a predetermined distance in a state in which the second connection line 22 is sandwiched between the third connection line 23 and the first connection line 21. In addition, in the following description, the third connection line 23 arranged at one side of the first connection line 21 is referred to as a "third connection line 23a" and the third connection line 23 arranged at the other side of the first connection line 21 may be referred to as a "third connection line 23b." The third connection line 23 connects the outer line 3 of the first digital phase shift circuit and the outer line 3 of the second digital phase shift circuit.

The first ground layer 24 is arranged above the first connection line 21. In the example shown in FIG. 6, the first ground layer 24 is provided above the first connection line 21 and the second connection line 22 with separated by a predetermined distance. It is preferable to arrange the first ground layer 24 above the first connection line 21 and extend the width of the first ground layer 24 to at least one side surface 220 of each second connection line 22. The side surface 220 is a side surface opposite to a side at which the first connection line 21 is arranged among side surfaces of the second connection line 22. In addition, the first ground layer 24 may extend not only above the first connection line 21 and the second connection line 22, but also above the third connection line 23.

The first ground layer 24 is connected to the second connection lines 22 via via-holes 40. That is, the first ground layer 24 is connected to the second connection line 22a and the second connection line 22b via the via-holes 40. As shown in FIG. 5, a plurality of via-holes 40 are arranged along the second connection line 22a and a plurality of via-holes 40 are arranged along the second connection line 22b.

Figure 7:
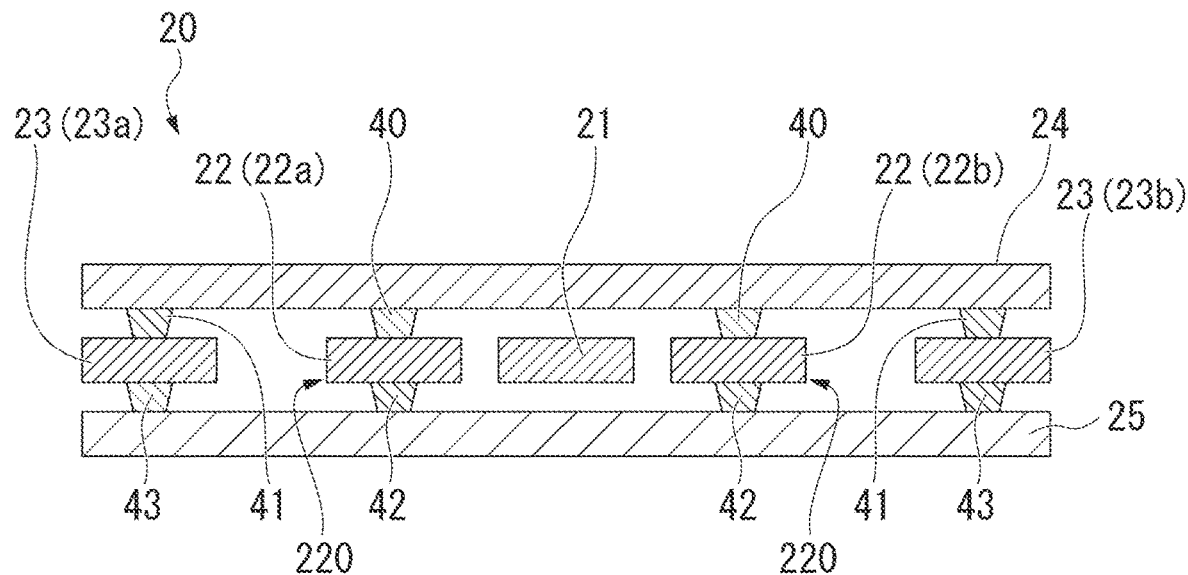
FIG. 7 is a second cross-sectional view of the connection unit according to the present embodiment.

When the first ground layer 24 extends above the third connection lines 23, the first ground layer 24 may be connected to second connection lines 22 via the via-holes 40 and may be connected to third connection lines 23 via via-holes 41, as illustrated in FIG. 7. That is, the first ground layer 24 may be connected to the second connection line 22a and the second connection line 22b via the via-holes 40 and the first ground layer 24 may be connected to the third connection line 23a and the third connection line 23b via the via-holes 41. In addition, in the configuration illustrated in FIG. 7, a plurality of via-holes 41 are arranged along the third connection line 23a and a plurality of via-holes 41 are arranged along the third connection line 23b.

The second ground layer 25 is arranged below the first connection line 21. In the example shown in FIG. 6, the second ground layer 25 is provided below the first connection line 21 and the second connection line 22 with separated by a predetermined distance. It is preferable to arrange the second ground layer 25 below the first connection line 21 and extend the width of the second ground layer 25 to at least one side surface 220 of each second connection line 22. In addition, the second ground layer 25 may extend not only below the first connection line 21 and the second connection line 22, but also below the third connection line 23.

The second ground layer 25 is connected to second connection lines 22 via via-holes 42. That is, the second ground layer 25 is connected to the second connection line 22a and the second connection line 22b via the via-holes 42. Like the via-holes 40, a plurality of via-holes 42 are arranged along the second connection line 22a and a plurality of via-holes 42 are arranged along the second connection line 22b.

When the second ground layer 25 extends below the third connection lines 23, the second ground layer 25 may be connected to second connection lines 22 via the via-holes 42 and may be connected to third connection lines 23 via via-holes 43, as illustrated in FIG. 7. That is, the second ground layer 25 may be connected to the second connection line 22a and the second connection line 22b via the via-holes 42 and may be connected to the third connection line 23a and the third connection line 23b via the via-holes 43. In addition, in the configuration illustrated in FIG. 7, like the via-holes 41, a plurality of via-holes 43 are arranged along the third connection line 23a and a plurality of via-holes 43 are arranged along the third connection line 23b.

Although the connection unit 20 includes the first ground layer 24 and the second ground layer 25 in the example shown in FIGS. 6 and 7, the present invention is not limited thereto and it is only necessary to provide at least one of the first ground layer 24 and the second ground layer 25. That is, it is only necessary to arrange a ground layer at least one of above and below the first connection line 21.

Figure 8:
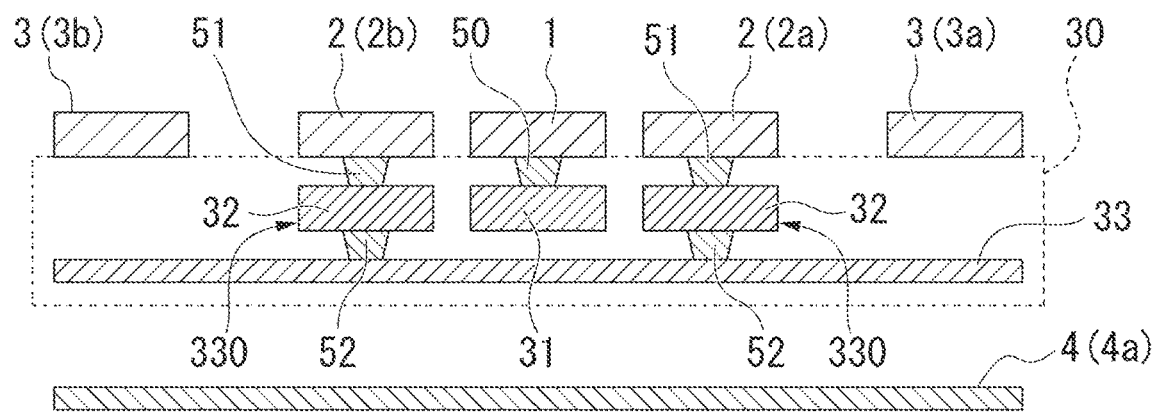
FIG. 8 is a first cross-sectional view of a transmission unit according to the present embodiment.
Figure 9:
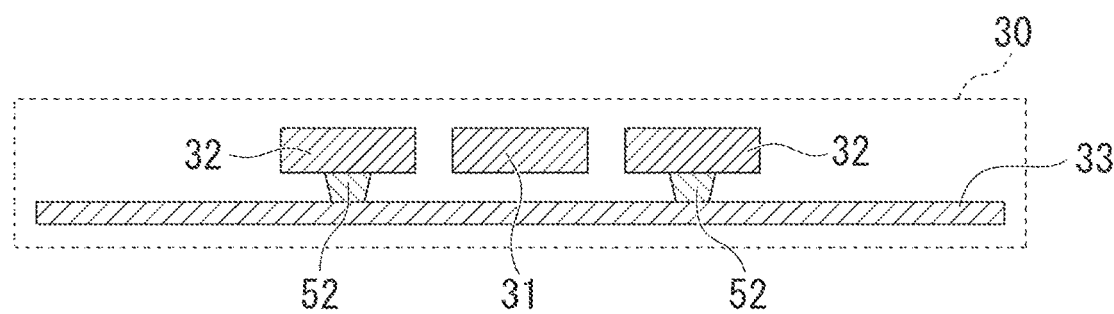
FIG. 9 is a second cross-sectional view of the transmission unit according to the present embodiment.
Figure 10:
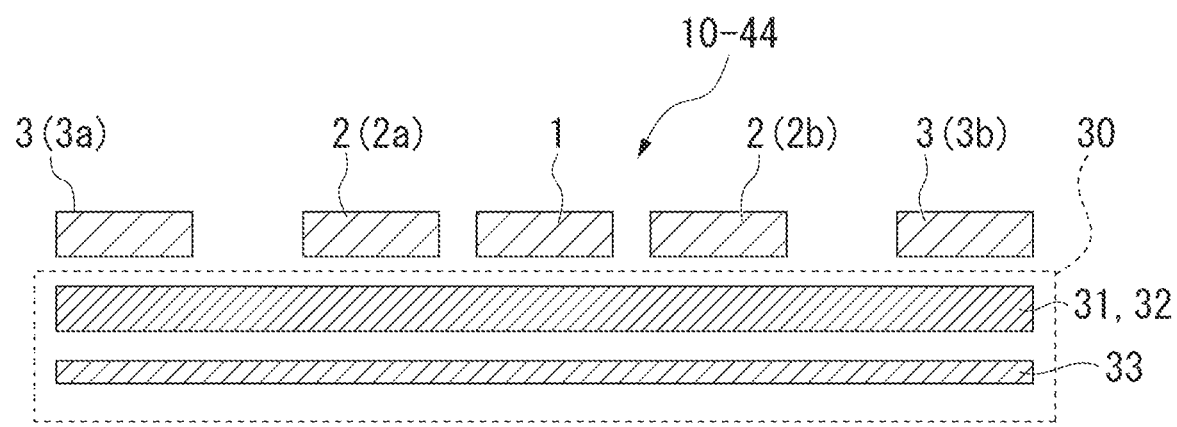
FIG. 10 is a third cross-sectional view of the transmission unit according to the present embodiment.

Hereinafter, the configuration of the transmission unit 30 according to the present embodiment are described with reference to FIGS. 8 to 10. FIG. 8 is a cross-sectional view of the transmission unit 30 taken along line VIII-VIII shown in FIG. 1. FIG. 9 is a cross-sectional view of the transmission unit 30 taken along IX-IX line shown in FIG. 1. FIG. 10 is a cross-sectional view of the transmission unit 30 taken along line X-X shown in FIG. 1.

The transmission unit 30 includes a transmission line 31, a ground line 32, and a third ground layer 33.

The transmission line 31 is connected to the signal line 1 of the terminal digital phase shift circuit. The transmission line 31 is, for example, a long plate-shaped conductor having a constant width, a certain thickness, and a predetermined length. The transmission line 31 is formed on a layer different from that of the signal line 1 of the terminal digital phase shift circuit. For example, the transmission line 31 is formed on a layer that is positioned one-layer below the layer where the signal line 1 of the terminal digital phase shift circuit is formed. The transmission line 31 is connected to the signal line 1 of the terminal digital phase shift circuit via via-holes 50.

The ground line 32 is connected to the inner line 2 of the terminal digital phase shift circuit. The ground line 32 is a long plate-shaped conductor having a constant width, a certain thickness, and a predetermined length. The ground line 32 extends in a direction that is the same as the extension direction of the transmission line 31. The ground line 32 is provided parallel to the transmission line 31 with separated by a predetermined distance. Specifically, the ground lines 32 are arranged to be separated from the predetermined distance from the transmission line 31 at both sides of the transmission line 31. In addition, the distance between the ground line 32 and the transmission line 31 may be the same as or different from the distance between the inner line 2 and the signal line 1. The ground line 32 is connected to the inner line 2 of the terminal digital phase shift circuit via via-holes 51.

The third ground layer 33 is arranged below the transmission line 31. The third ground layer 33 illustrated in FIGS. 8 to 10 extends from the first outer line 3a to the second outer line 3b. In addition, the third ground layer 33 may extend to at least a side surface 330 of one side of each ground line 32. The side surface 330 is a side surface of the ground line 32 opposite to a side where the transmission line 31 is arranged among side surfaces of the ground line 32. The third ground layer 33 is provided below the transmission line 31 and the ground line 32 with separated by a predetermined distance. Although the third ground layer 33 is arranged only below the transmission line 31 in the present embodiment, the third ground layer 33 may be arranged only above the transmission line 31 or the third ground layer 33 may be arranged above and below the transmission line 31.

The third ground layer 33 is connected to the ground line 32 via via-holes 52. That is, the third ground layer 33 is connected to the inner line 2 of the terminal digital phase shift circuit via the via-holes 52, the ground line 32, and the via-holes 51. In addition, the ground line 32 can also be omitted. When the ground line 32 is omitted, the third ground layer 33 may be connected to the inner line 2 of the terminal digital phase shift circuit via via-holes (not shown). Also, the third ground layer 33 may be connected to the outer line 3 of the terminal digital phase shift circuit via via-holes (not shown).

Also, even if the third ground layer 33 is arranged above the transmission line 31, the third ground layer 33 may be connected to the inner line 2 of the terminal digital phase shift circuit and the ground line 32 via via-holes or the third ground layer 33 may be connected to the outer line 3 of the terminal digital phase shift circuit via via-holes.

In this case, the third ground layer 33 may be connected to the inner line 2 of the terminal digital phase shift circuit and the ground line 32 via different via-holes or the third ground layer 33 may be connected to the outer line 3 of the terminal digital phase shift circuit and the ground line 32 via different via-holes.

As shown in FIG. 10, the transmission unit 30 is formed on a layer different from a layer where the signal line 1, two inner lines 2 (a first inner line 2a and a second inner line 2b), and two outer lines 3 (a first outer line 3a and a second outer line 3b) provided in the digital phase shift circuit 10-44 are formed. Also, the transmission unit 30 is formed to extend in a direction intersecting the signal line 1, the two inner lines 2, and the two outer lines 3 provided in the digital phase shift circuit 10-44. In addition, as shown in FIG. 1, the transmission unit 30 is formed on a layer different from the layer where the signal line 1, the two inner lines 2, and the two outer lines 3 provided in the digital phase shift circuit 10-16 are formed. Also, the transmission unit 30 is formed to extend in a direction intersecting the signal line 1, the two inner lines 2, and the two outer lines 3 provided in the digital phase shift circuit 10-16.

As described above, the digital phase shifter 100 according to the present embodiment includes a plurality of digital phase shift circuits 10 connected in cascade and one or more bend-type connection units 20 configured to make a connection between the two digital phase shift circuits 10. Also, the plurality of digital phase shift circuits 10 connected in cascade are arranged in a spiral shape via the connection unit 20. According to this configuration, as shown in FIG. 1, it is possible to minimize the number of portions where the directions in which return currents R1 flowing through the outer lines 3 are opposite to each other while implementing miniaturization. Therefore, the number of portions where magnetic fields generated in the outer lines 3 weaken each other can be reduced.

Figure 11:
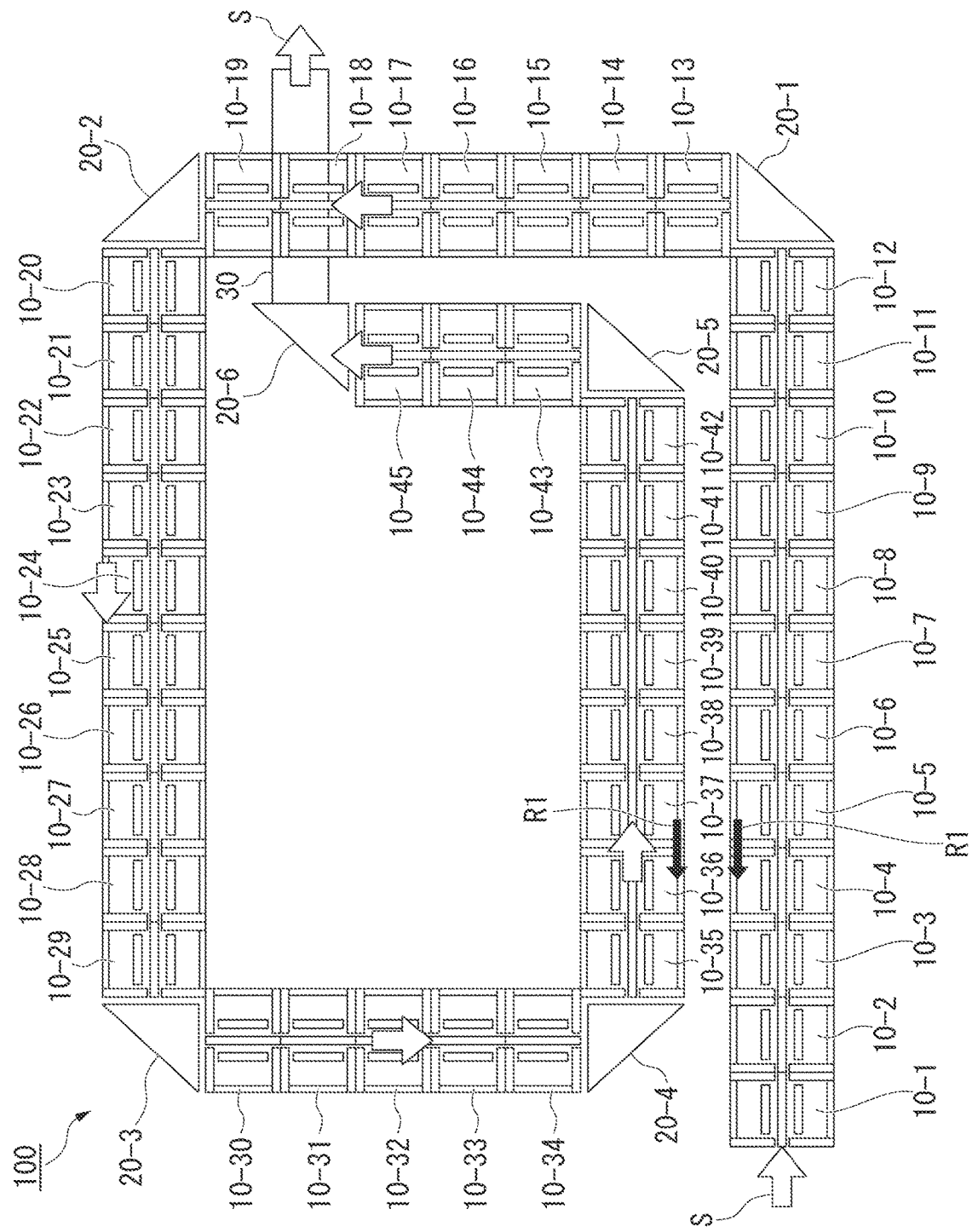
FIG. 11 is a diagram showing a first modified example of the digital phase shift circuit according to the present embodiment.

Although the present invention are described based on preferred embodiments, the present invention is not limited to the above-described embodiments and various modifications can be made without departing from the scope of the present invention. For example, the plurality of digital phase shift circuits 10 connected in cascade may be arranged in a spiral shape as shown in FIG. 11. Thereby, it is possible to eliminate portions where the directions in which return currents R1 flowing through the outer lines 3 are opposite to each other and further reduce the number of portions where magnetic fields generated in the outer lines 3 weaken each other. In addition, in the example shown in FIG. 11, the transmission unit 30 is connected to the digital phase shift circuit 10-45, which is a terminal digital phase shift circuit, via the connection unit 20-6.

Figure 12:
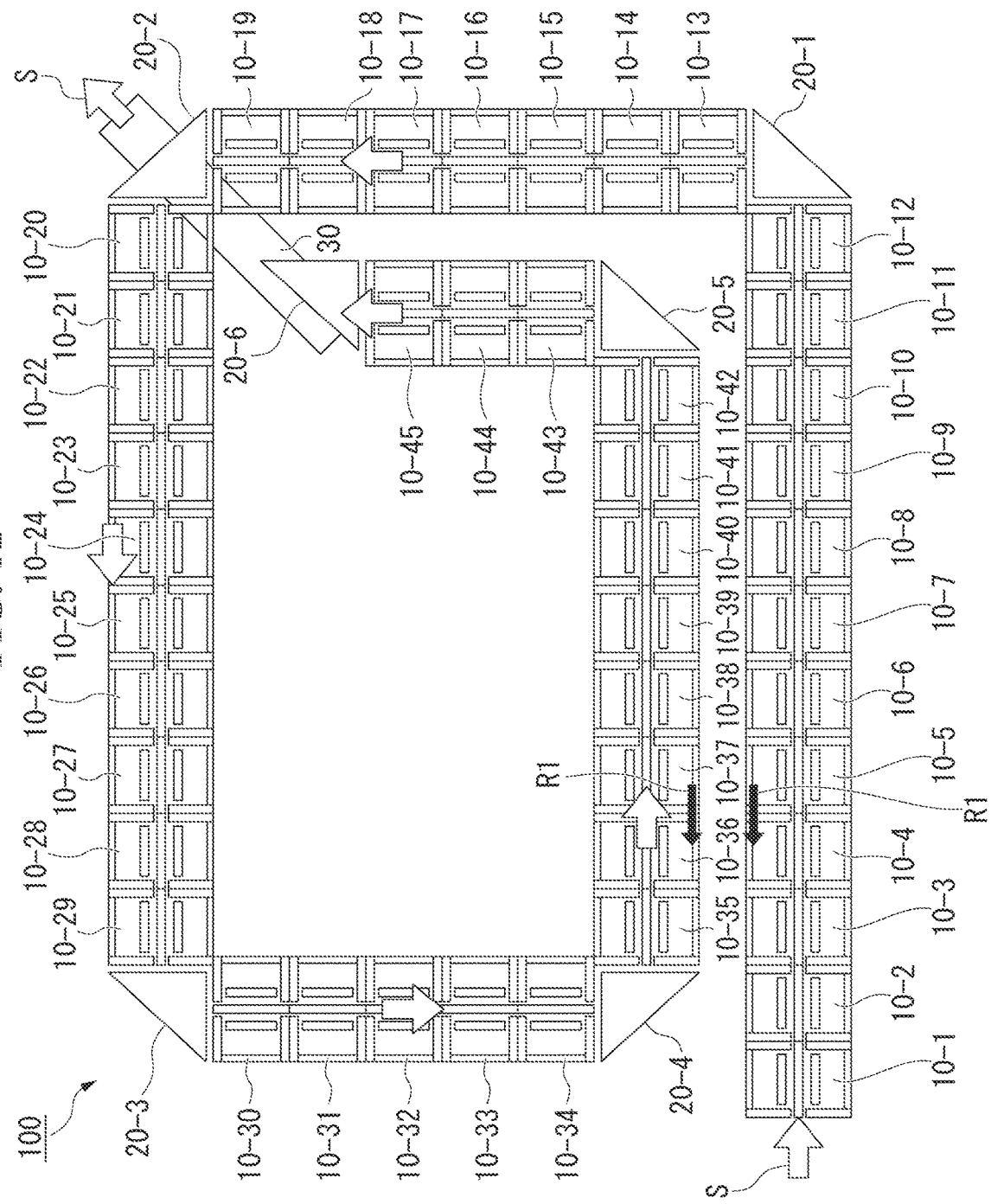
FIG. 12 is a diagram showing a second modified example of the digital phase shift circuit according to the present embodiment.
Figure 13:
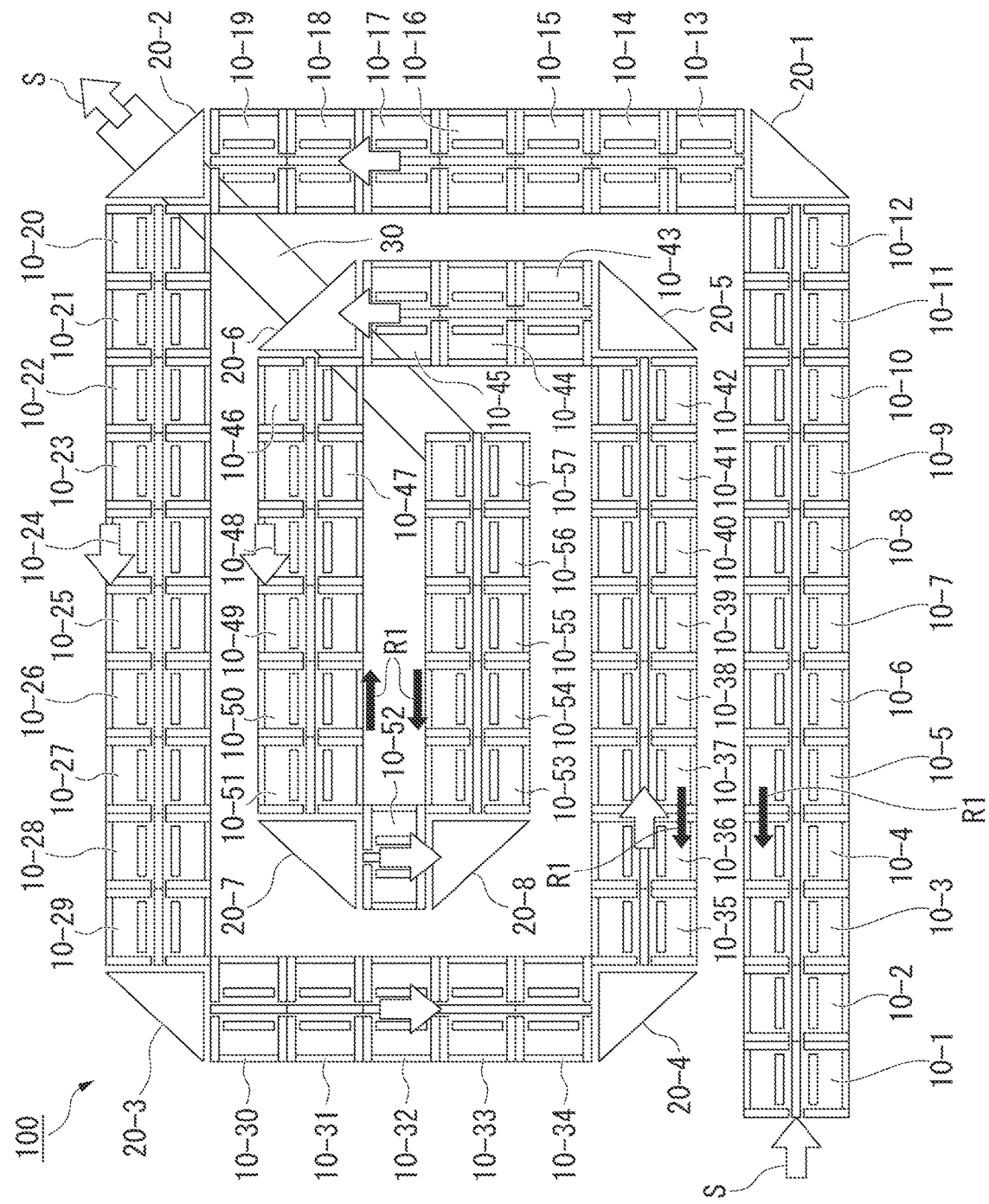
FIG. 13 is a diagram showing a third modified example of the digital phase shift circuit according to the present embodiment.

Although the transmission unit 30 shown in FIG. 1 is formed on a layer above or below the layer where the signal line 1 of the digital phase shift circuit 10-16 and the signal line of the digital phase shift circuit 10-44 are formed, the present invention is not limited thereto. For example, as shown in FIG. 12, the transmission unit 30 may be formed above or below the connection unit 20-2. For example, as shown in FIG. 13, the transmission unit 30 may be formed above or below the connection unit 20-2 and the connection unit 20-6.

REFERENCE SIGNS LIST

1 Signal line
2 Inner line
2a First inner line
2b Second inner line
3 Outer line
3a First outer line
3b Second outer line
4 Ground conductor
5 Parallel plate capacitor
6 Connection conductor
7 Electronic switch
8 Switch controller
10 Digital phase shift circuit
20 Connection unit
21 First connection line
22 Second connection line
23 Third connection line
24 First ground layer (connection-unit ground layer)
25 Second ground layer (connection-unit ground layer)
30 Transmission unit
31 Transmission line
32 Ground line
33 Third ground layer (transmission-unit ground layer)
40, 42 Via-hole (connection-unit via-hole)
51, 52 Via-hole (transmission-unit via-hole)
100 Digital phase shifter

The invention claimed is:

1. A digital phase shifter comprising:
a plurality of digital phase shift circuits connected in cascade; and
one or more bend-type connection units each configured to make a connection between two digital phase shift circuits of the plurality of digital phase shift circuits,
wherein each of the digital phase shift circuits includes at least a signal line, a pair of inner lines having a respective inner line of the pair at each side of the signal line, a pair of outer lines provided outside of the inner lines, a first ground conductor connected to one ends of the inner lines and the outer lines, a second ground conductor connected to the other ends of the outer lines, and a pair of electronic switches provided between the other ends of the inner lines and the second ground conductor,
wherein each of the digital phase shift circuits is a circuit set in a low-delay mode in which a return current flows through the pair of inner lines or a high-delay mode in which a return current flows through the pair of outer lines, and
wherein the plurality of digital phase shift circuits connected in cascade are arranged in a spiral shape via the connection units.

2. The digital phase shifter according to claim 1, further comprising a transmission line connected to the signal line of a terminal digital phase shift circuit that is the digital phase shift circuit located at an innermost circumference among the plurality of digital phase shift circuits arranged in the spiral shape and through which a high-frequency signal flowing through the signal line is transmitted,
wherein the transmission line is formed above or below the connection unit.

3. The digital phase shifter according to claim 1, wherein each of the connection units has a structure that is bent at 90 degrees.

4. The digital phase shifter according to claim 1, further comprising a transmission line connected to the signal line of a terminal digital phase shift circuit that is the digital phase shift circuit located at an innermost circumference among the plurality of digital phase shift circuits arranged in the spiral shape and through which a high-frequency signal flowing through the signal line is transmitted,
wherein the transmission line is formed on a layer different from a layer where the signal line is formed.

5. The digital phase shifter according to claim 4, further comprising a transmission-unit ground layer arranged at least one of above and below the transmission line,
wherein the transmission-unit ground layer is connected to at least one of the pair of inner lines or the pair of outer lines via a transmission-unit via-hole.

6. The digital phase shifter according to claim 5, comprising a ground line connected to the pair of inner lines of the terminal digital phase shift circuit and extending along the transmission line.

7. The digital phase shifter according to claim 6, wherein the transmission-unit ground layer is connected to at least the ground line via the transmission-unit via-hole or a via-hole different from the transmission-unit via-hole.

8. The digital phase shifter according to claim 1, wherein the connection unit includes:
- a first connection line configured to connect the signal line of one digital phase shift circuit of the two digital phase shift circuits and the signal line of the other digital phase shift circuit of the two digital phase shift circuits;
- a pair of second connection lines respectively configured to connect one inner line of the pair of inner lines of the one digital phase shift circuit and one inner line of the pair of inner lines of the other digital phase shift circuit, and connect the other inner line of the pair of inner lines of the one digital phase shift circuit and the other inner line of the pair of inner lines of the other digital phase shift circuit; and
- a connection-unit ground layer arranged at least one of above and below the first connection line.

9. The digital phase shifter according to claim 8, further comprising a pair of third connection lines respectively configured to connect one outer line of the pair of outer lines of the one digital phase shift circuit and one outer line of the pair of outer lines of the other digital phase shift circuit, and connect the other outer line of the pair of outer lines of the one digital phase shift circuit and the other outer line of the pair of outer lines of the other digital phase shift circuit.

10. The digital phase shifter according to claim 8, wherein the second connection line and the connection-unit ground layer are connected by a connection-unit via-hole.

* * * * *